United States Patent
Colle et al.

(10) Patent No.: US 7,434,181 B2
(45) Date of Patent: Oct. 7, 2008

(54) DEBUGGER OF AN ELECTRONIC CIRCUIT MANUFACTURED BASED ON A PROGRAM IN HARDWARE DESCRIPTION LANGUAGE

(75) Inventors: Pierre Colle, La Ierrasse (FR); Anne Waniens, Grenoble (FR); Thomas Guillemin, Grenoble (FR)

(73) Assignee: Temento Systems (FR)

(*) Notice: Subject to any disclaimer, the term of this patent is extended or adjusted under 35 U.S.C. 154(b) by 396 days.

(21) Appl. No.: 11/136,119

(22) Filed: May 24, 2005

(65) Prior Publication Data

US 2005/0273660 A1    Dec. 8, 2005

(30) Foreign Application Priority Data

May 26, 2004    (FR) ................................. 04 51039

(51) Int. Cl.
*G06F 17/50* (2006.01)
(52) U.S. Cl. .................... 716/4; 716/5; 716/6; 716/17; 716/18
(58) Field of Classification Search ..................... 716/4, 716/5, 6, 17, 18; 703/14
See application file for complete search history.

(56) References Cited

U.S. PATENT DOCUMENTS

| | | | | |
|---|---|---|---|---|
| 6,477,683 B1 * | 11/2002 | Killian et al. ................... | 716/1 |
| 6,581,191 B1 * | 6/2003 | Schubert et al. ................ | 716/4 |
| 6,618,839 B1 * | 9/2003 | Beardslee et al. .............. | 716/4 |
| 7,240,303 B1 * | 7/2007 | Schubert et al. ................ | 716/4 |
| 2003/0131325 A1 | 7/2003 | Schubert et al. | |

OTHER PUBLICATIONS

Wakabayashi et al., "C-Band SoC Design Flow and EDA Tools: An ASIC and System Vendor Respective", Dec. 2000, IEEE Transactions on Computer-Aided Design of Integrated Circuits and Systems, vol. 19, No. 12, pp. 1507-1522.*
International Search Report dated Feb. 11, 2005 for related French Patent Application No. FR 04/51039 of May 26, 2004.

* cited by examiner

*Primary Examiner*—Sun J Lin
(74) *Attorney, Agent, or Firm*—Howard IP Law Group, PC

(57) ABSTRACT

A device for debugging an electronic circuit manufactured based on an initial program in hardware description language comprising an instrumentation unit capable of determining a first additional circuit capable of activating a first observation signal representative of the operation of a portion of the electronic circuit corresponding to a determined portion of the initial program, a second additional circuit capable of receiving at least one input signal and of activating a condition signal when a condition on the input signal is fulfilled, a third additional circuit capable of activating a second observation signal when the condition signal is activated, a fourth additional circuit capable of memorizing data representative of the order of activation of the first and second observation signals and capable of providing a modified program incorporating the additional circuits, and a debugging unit capable of debugging a modified electronic circuit manufactured based on the modified program.

10 Claims, 2 Drawing Sheets

DEBUGGER OF AN ELECTRONIC CIRCUIT MANUFACTURED BASED ON A PROGRAM IN HARDWARE DESCRIPTION LANGUAGE

CLAIM FOR PRIORITY

This application claims the benefit of French Application No. 04/51039, filed May 26, 2004 and is incorporated herein by reference.

BACKGROUND OF THE INVENTION

1. Field of the Invention

The present invention relates to a device and a method for debugging an electronic circuit described by a program written in a hardware description language or HDL.

2. Discussion of the Related Art

The HDL language is a programming language which has been developed and optimized for the design and the modeling of electronic circuits since it enables accurately describing the behavior of electronic circuits. It is, for example, the VHDL language (for VHSIC Hardware Description Language, with VHSIC standing for Very High Speed Integrated-Circuit), or the Verilog language.

Examples of electronic circuits formed based on HDL programs are Field Programmable Gate Array (FPGA) circuits or Application Specific Integrated circuits, or ASIC. More specifically, an FPGA circuit comprises electronic gates preimplanted on a circuit according to a given topology. In the initial state, these gates are not interconnected. To form an electronic circuit implementing specific functions based on an FPGA circuit, it is enough to create certain connections (which can be obtained by the turning-on of MOS transistors) between certain electronic gates of the FPGA to obtain the desired functions. For this purpose, a RAM in which configuration data (bitstream) especially representing circuit connections are stored may be used. The bitstream data are obtained from the HDL program describing the electronic circuit.

During the complete design process of an electronic circuit, it is necessary to provide a debugging step which comprises the error detection, diagnosis and correction, during the electronic circuit operation. For an electronic circuit designed based on an HDL program, an error correction may correspond to a modification of the HDL program describing the electronic circuit.

There currently mainly exist two types of methods for debugging an electronic circuit obtained from an HDL program.

The first method consists of using a logic analyzer. It may for example be the logic analyzer sold by Altera Company under trade name Signal TAP. A logic analyzer enables modifying the initial HDL program describing an electronic circuit to obtain a modified HDL program which describes the same electronic circuit with additional circuits which generally have no influence upon the behavior of the electronic circuit and which implement specific functions useful to debug the electronic circuit. An additional circuit may perform logic operations on given signals used by the electronic circuit and provide an alert signal when a logic condition is fulfilled, check the values of several signals in parallel, etc. The debugging of an FPGA circuit programmed from the initial HDL program is carried out by programming the FPGA circuit with the modified HDL program. The modified FPGA circuit is then operated in real time in its normal operation environment, and the logic analyzer is used to collect the different signals provided by the additional circuits added to the electronic circuit described by the initial HDL program.

However, a logic analyzer only provides a timing diagram of the signals provided by the additional circuit during the operation of the electronic circuit. A subsequent analysis of such signals is necessary to determine, in the case of the detection of an in-service error, whether such an error is due to a wrong design of the initial HDL description program and, if such is the case, to which part of the program the error having occurred is associated. Such an analysis can be excessively complex, all the more if the electronic circuit itself is complex.

The second method corresponds to a direct debugging of the HDL program. Such a debugging method may be implemented by mean of the debugger sold by Synplicity Company under trade name Identify. Such a debugger enables inserting watchpoints at the level of certain parts of an initial HDL program describing an electronic circuit and providing a modified HDL program from which an FPGA circuit, for example, is programmed. Upon operation of the modified FPGA circuit thus programmed, the debugger exchanges signals with the FPGA circuit and can indicate to a user whether the parts of the initial HDL program marked with watchpoints have been executed during the operation of the FPGA circuit. The debugger can also indicate the value of signals used by the initial HDL program at the time when the marked parts of the initial HDL program are executed. If errors occur during the operation of the FPGA circuit, the user can locate the parts of the initial HDL program at the level of which the errors have occurred.

However, such a debugger, being purely code-oriented, does not enable building complex verification scenarios based on the values of the signals used by the FPGA circuit. The absence of a tool of logic analyzer type can make the detection of certain errors upon operation of the FPGA circuit or the determination of the origin of certain detected errors difficult.

SUMMARY OF THE INVENTION

An object of the present invention is to provide a device and a method for debugging an electronic circuit described by an HDL program which eases the electronic circuit debugging operation.

To achieve this object, the present invention provides a device for debugging an electronic circuit manufactured based on an initial program in hardware description language, HDL, comprising an instrumentation unit capable of receiving the initial program; determining a first additional circuit to be incorporated in the electronic circuit and capable of activating a first observation signal representative of the operation of a portion of the electronic circuit corresponding to a determined portion of the initial program; determining a second additional circuit to be incorporated in the electronic circuit and capable of receiving at least one input signal and of activating a condition signal when a condition on the input signal is fulfilled during the operation of the electronic circuit, and a third additional circuit to be incorporated in the electronic circuit and capable of activating a second observation signal when the condition signal is activated; determining a fourth additional circuit to be incorporated in the electronic circuit and capable of memorizing data representative of the order of activation of the first and second observation signals; and providing a modified program in HDL language based on the initial program incorporating a description in HDL language of the first, second, third, and fourth additional circuits; and a debugging unit capable of debugging a modified electronic circuit manufactured based on the modified program by interacting with the modified electronic circuit via the fourth additional circuit.

According to an embodiment of the present invention, the debugging unit is, further, capable, based on said representative data, of displaying a reference of said determined portion of the initial program associated with the first observation signal and a reference of said second additional circuit associated with the second observation signal according to said order of activation of the first and second observation signals.

According to an embodiment of the present invention, the first additional circuit is capable of assigning to the first observation signal a value from among two distinct values, and of activating the first observation signal by assigning to the first observation signal the other value from among the two distinct values with respect to the preceding value of the first observation signal.

According to an embodiment of the present invention, the third additional circuit is capable of assigning to the second observation signal a value from among two distinct values, and of activating the second observation signal by assigning to the second observation signal the other value from among the two distinct values with respect to the preceding value of the second observation signal.

According to an embodiment of the present invention, the debugging unit is further capable of memorizing the value of the condition signal of the first observation signal and/or of the second observation signal.

According to an embodiment of the present invention, the electronic circuit is a programmable gate array circuit programmed based on the initial program and the modified electronic circuit is a programmable gate array circuit programmed based on the modified program.

The present invention also provides a method for debugging an electronic circuit manufactured based on an initial program in hardware description language, HDL, comprising the steps of determining a first additional circuit to be incorporated in the electronic circuit and capable of activating a first observation signal representative of the operation of a portion of the electronic circuit corresponding to a determined portion of the initial program; determining a second additional circuit to be incorporated in the electronic circuit and capable of receiving an input signal and of activating a condition signal when a condition on the input signal is fulfilled during the operation of the electronic circuit, and a third additional circuit to be incorporated in the electronic circuit and capable of activating a second observation signal when the condition signal is activated; determining a fourth additional circuit to be incorporated in the electronic circuit and capable of memorizing data representative of the order of activation of the first and second observation signals; providing a modified program in HDL language based on the initial program incorporating a description in HDL language of the first, second, third, and fourth additional circuits; manufacturing a modified electronic circuit based on the modified program; and debugging the modified electronic circuit by interacting with the modified electronic circuit via the fourth additional circuit.

According to an embodiment of the present invention, the method further comprises the step of, based on said representative data, displaying a reference of said determined portion of the initial program associated with the first observation signal and a reference of said second additional circuit associated with the second observation signal according to said order of activation of the first and second observation signals.

According to an embodiment of the present invention, the method further comprises the step of memorizing the value of the condition signal upon activation of the first observation signal and/or of the second observation signal.

The present invention also provides using the device such as described hereabove to determine the code coverage rate of the initial program upon execution of tests.

The foregoing and other objects, features, and advantages of the present invention will be discussed in detail in the following non-limiting description of specific embodiments in connection with the accompanying drawings.

DETAILED DESCRIPTION

Figure 1:
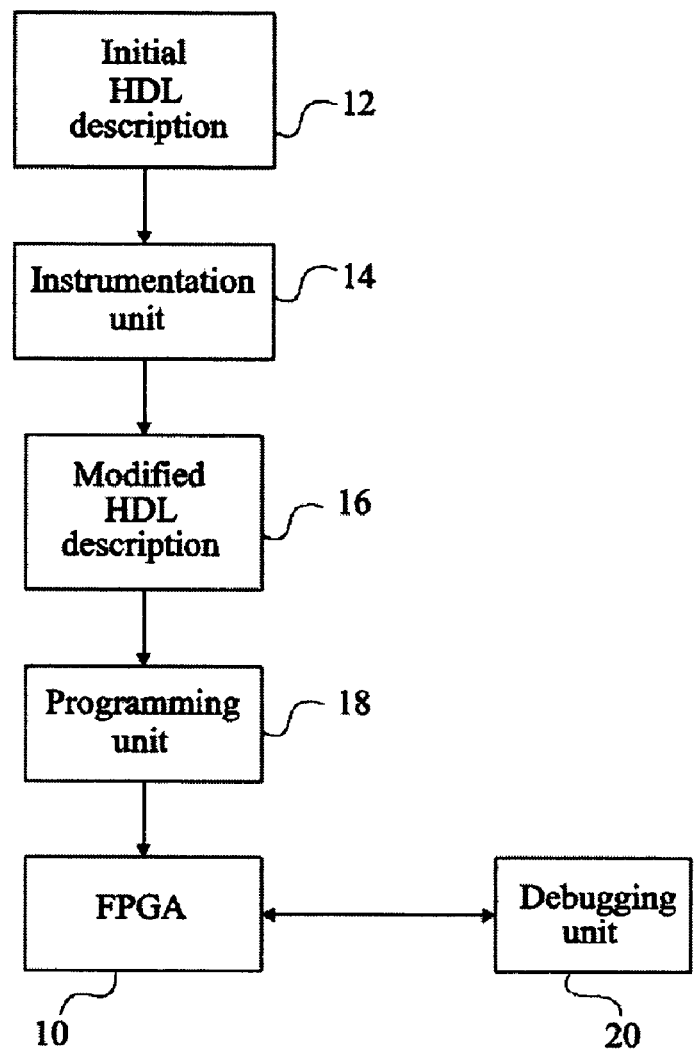
FIG. 1 generally illustrates the steps of an example of implementation of the debugging method according to the present invention.

Same elements have been designated with same reference numerals in the different drawings. For clarity, only those elements which are necessary to the understanding of the present invention have been shown.

FIG. 1 illustrates, in the form of a block diagram, an example of implementation of the debugging method according to the present invention. In the following description, the debugging method according to the present invention will be described for the debugging of an FPGA circuit 10 which is desired to be programmed based on an initial HDL program 12. However, the present invention also applies to the debugging of a dedicated electronic circuit, for example, of ASIC type, manufactured based on initial HDL program 12.

The debugging method according to the present invention comprises an instrumentation unit 14 capable of receiving the initial HDL program and of providing a modified HDL program 16 based on the initial HDL program according to instructions provided by a user, as described in more detail hereafter. For this purpose, instrumentation unit 14 comprises a man/machine interface comprising, for example, a display screen, a mouse and a keyboard, or any other adapted means.

Modified HDL program 16 is then provided to a programming unit 18 conventionally capable of programming FPGA circuit 10 based on modified HDL program 16 and the operation of which will not be described in further detail.

The debugging device according to the present invention comprises a debugging unit 20 which, upon operation of the FPGA circuit programmed based on the modified HDL program, is capable of exchanging data with FPGA circuit 10 and of providing the user with indications as to the progress of the debugging operation via the man/machine interface. The data exchange between debugging unit 20 and FPGA circuit 10 is, for example, performed via dedicated pins of FPGA circuit 10, according to the JTAG test protocol defined by IEEE standard 1149.1.

Figure 2:
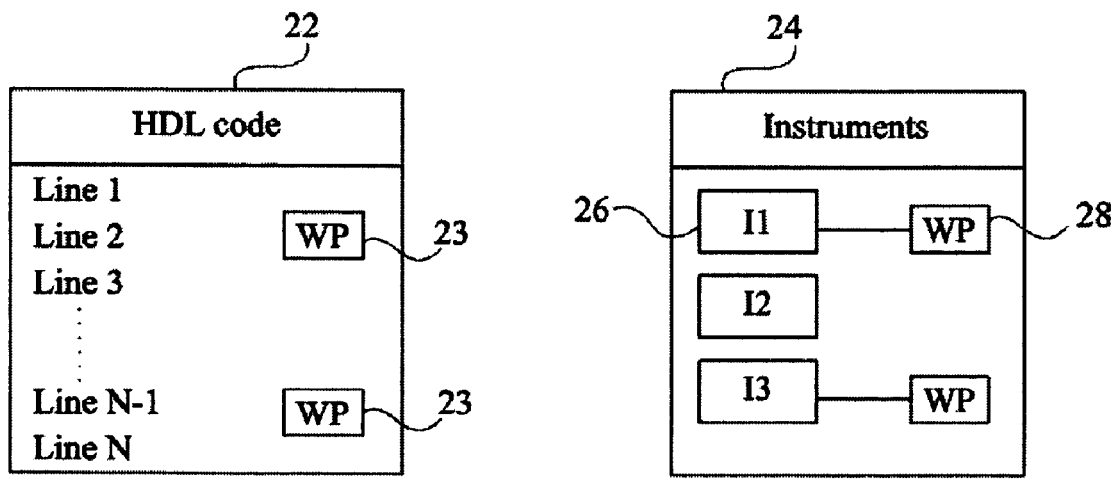
FIG. 2 schematically shows an example of a graphic interface of the debugging device according to the present invention upon preparation of a debugging operation.

FIG. 2 shows an example of display on the display screen of the instrumentation unit 14 used to modify the initial HDL program 12. A window 22, called the HDL Code window, enables the user to visualize all the instructions of initial HDL program 12. As an example, initial HDL program 12 may be displayed as successive lines, Line1 to LineN, where N is an integer, each line corresponding to a program instruction. The user may conventionally place watchpoints, shown in FIG. 2 as blocks 23, at the level of one or several lines of the initial HDL program in Code window 22. Such a watchpoint is capable of providing an observation signal in an active state when the line of the initial HDL program with which the watchpoint is association is executed by FPGA circuit 10.

A window 24, called the Instrument window, provides the user with a list of blocks 26, each block being associated with a debugging tool capable of helping the user during the debugging operation. These may be tools provided by the logic analyzer sold by Temento Company under trade name DLI. As an example, the tools provided by instrumentation unit 14 especially correspond to the following non-exhaustive list:

a tool receiving input signals and providing one or several output signals by performing logic operations on the input signals, the logic operations being possibly defined by the user;

a tool simultaneously comparing the values of several input signals with predefined values and indicating, for example by providing an output signal in the active state, whether the values of the input signals are, at a given time, equal to the predefined values;

a tool observing the time variation of a signal and indicating whether the sequence of values taken by the observed signal corresponds to a sequence of predefined values;

a tool observing the time variation of a signal and indicating whether the observed signal exhibits a transient pulse; and a tool analyzing the data flows on buses of the electronic circuit, for example, by measuring the bit rate on the bus or the bus occupation.

The user may choose some tools from among the provided tools and define which signals supply these tools. The user may also interconnect the tools, an output of a tool driving an input of another tool. This enables the user to obtain complex debugging tools based on the tools initially provided by instrumentation unit 14.

The present invention consists of providing a specific tool enabling associating an observation tool with one or several tools selected by the user or with a tool created by the user based on the tools provided by instrumentation unit 14. The observation tools are shown in FIG. 2 as blocks 28. An observation tool provides, for example, an observation signal in an active state when an output signal of the associated debugging tool takes a determined value, indicating, for example, that the condition observed by debugging tool 26 has been fulfilled.

Once debugging tools 26 have been defined and observation tools 28 have been installed, instrumentation unit 14 modifies initial HDL program 12 to provide a modified HDL program 16 based on which the FPGA circuit is programmed. The FPGA circuit is then operated by being connected to debugging unit 20.

The installation of the observation tools 28 associated with debugging tools 26 may be performed in manual, semi-automatic, or fully automatic fashion. As an example, instrumentation unit 14 automatically places an observation tool 28 at the level of each debugging tool 26 performing a specific function.

Figure 3:
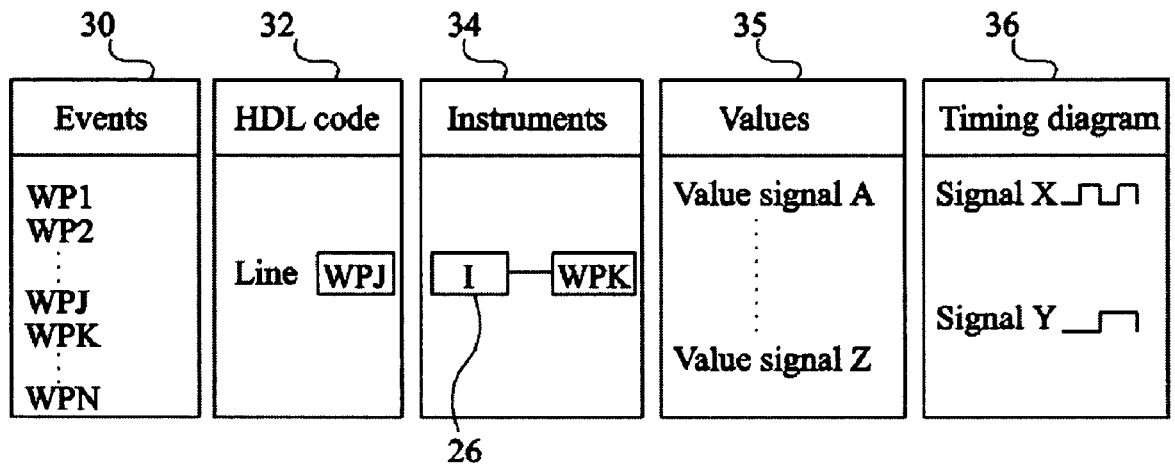
FIG. 3 schematically shows an example of a graphic interface of the debugging device according to the present invention during a debugging operation.

FIG. 3 shows an example of display on the display screen in a debugging operation of the FPGA circuit programmed based on modified HDL program 16.

A window 30, called the Event window, shows the data stored in an observation memory, for example, a RAM, during the debugging operation. More specifically, Event memory 30 indicates to the user the references of observation signals WP1 to WPN which have successively been activated upon operation of FPGA circuit 10. These are the observation signals corresponding to watchpoints associated with lines of the initial HDL program and to observation tools associated with debugging tools. The reference of the observation signals are displayed in Event window 30 in the order in which they have been activated by FPGA circuit 10. If several observation signals are simultaneously activated, they are displayed on a same line of Event window 30 to provide the user with this simultaneity information. The access to the observation memory via Event window 30 may be performed to order of the user or automatically upon reception of a combination of observation signals.

By selecting, in Event window 30, the reference of a specific observation signal provided by a watchpoint associated with a line of the initial HDL program, the user can cause the opening of a window 32, called the HDL Code window, in which are displayed successive lines of the initial HDL program, the program line associated with the considered watchpoint being, for example, placed at the center of HDL Code window 32. Further, by selecting, in Event window 30, the reference of a specific observation signal associated with an observation tool, the user may cause the opening of a window 34, called the Instrument window, in which is displayed the debugging tool 26 associated with the considered observation tool. Further, by selecting, in Event window 30, the reference of a specific observation signal associated with an observation tool, the user can cause the opening of a window 35, called the Value window, in which are displayed the values, at the time of the activation of the selected observation signal, of specific signals defined by the user and called user signals. These may be signals used by the initial HDL program or signals provided by the debugging tools. The user can also ask for the opening of a window 36, called the Timing-diagram window which, as conventional for a logic analyzer, provides a timing diagram of the different signals observed during the debugging operation.

Debugging unit 20 according to the present invention brings a significant help to the user upon debugging of FPGA circuit 10. Indeed, upon activation of observation signals associated with observation tools, debugging unit 20 may record the values of the user signals. The user can thus monitor the variation of the user signals upon successive activation of the observation signals.

Debugging unit 20 according to the present invention brings a significant help to the user upon determination of the logic cone of an observed error. As an example, the user may create a debugging tool providing a signal in an active state when a specific condition is fulfilled, such a condition indicating the occurrence of an error in the operation of FPGA circuit 10. The user then associates an observation tool with the debugging tool thus created and asks for the provision of an active observation signal by the observation tool to cause the automatic display of Event window 30. By comparing, in Event window 30, the relative position between the observation signal associated with the observation tool and adjacent observation signals associated with watchpoints of the initial HDL program, the user can determine which part of the initial HDL program has been executed before occurrence of the error, which can enable him to more easily determine the origin of the error.

Debugging unit 20 according to the present invention brings a significant help to the user to perform a correct code coverage of the initial HDL program. Indeed, after a set of tests has been performed, the user can have access to the content of the observation memory by displaying Event window 30. Based on the observation signals which have been activated during the operation of FPGA circuit 10, the user can determine which parts of the initial HDL program have been executed in the different tests. He can thus determine which parts of the initial HDL program have not been executed and define new tests to be added to ensure the execution of the entire initial HDL program.

According to an example of implementation, the insertion of a watchpoint in the initial HDL program may correspond to the addition of a function assigning to a binary observation signal the value opposite to the preceding value of the observation signal. For the debugging tools, the insertion of an observation tool connected to the output of the debugging tool assigns to an observation signal, likely to take two distinct values, the value opposite to the preceding value of the observation signal when the condition determined by the debugging tool is fulfilled during the operation of the FPGA circuit.

The activation of an observation signal is thus obtained at the switching of the observation signal value. All the observation signals associated with watchpoints or with observation tools are gathered in a vector by debugging unit 20 during a debugging operation. The state switching of at least one observation signal of the vector causes the recording by debugging unit 20:
  of the vector representative of all the observation signals; and
  of the values of the user signals.

Since the vector gathering all the observation signals is memorized, if several observation signals switch states simultaneously, the simultaneity information is kept.

An HDL program may implement several control clock signals used to synchronize different parts of the FPGA circuit programmed based on the HDL program. Each observation tool is then advantageously controlled by the control clock signal which has the highest frequency and the measurement of the observation signals is performed at highest control clock signal frequency so that any state switching of an observation signal is sensed.

Figure 4:
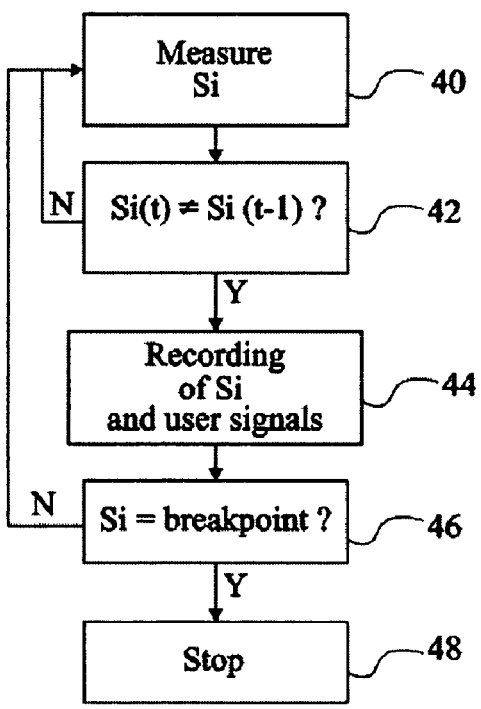
FIG. 4 illustrates, in more detailed fashion, given steps of the debugging method according to the present invention.

FIG. 4 shows in the form of a block diagram an example of a method for recording observation signals in a debugging operation. At step 40, debugging unit 20 measures the values of observation signals Si. At step 42, debugging unit 20 compares, for each observation signal Si, the measured value with the previously-measured value. If, for at least one observation signal, the measured value and the previously-measured value are different, the process carries on at step 44. If not, the process returns to step 40. At step 44, debugging unit 20 records in the observation memory the reference of the observation signal which has switched values and the current values of the user signals. At step 46, debugging unit 20 determines whether the observation signal(s) which have switched values correspond to breakpoints. If it is so, the process carries on at step 48. If not, the process returns to step 42. At step 48, debugging unit 40 stops the debugging operation and displays Event window 30 on the display screen so that the user can acknowledge which activated observation signal has caused the end of the debugging operation.

Instrumentation unit 14 may limit the number of observation signals for which debugging unit 20 determines whether the values of the observation signals have changed. The user can then place as many watchpoints and/or observation tools as he wishes to by means of instrumentation unit 14, but is limited by the number of observation signals taken into account by debugging unit 20 in a debugging operation. For this purpose, the user indicates to debugging unit 20, before starting the debugging operation, which observation signals are to be observed. This enables limiting the number of data exchanged between FPGA circuit 10 and debugging unit 20 in a debugging operation. Instrumentation unit 14 also enables advantageously limiting the size of the observation memory, that is, only the references of a determined number of the last activated observation signals are for example stored in the observation memory.

Of course, the present invention is likely to have various alterations, modifications, and improvements which will readily occur to those skilled in the art. In particular, some of the windows shown in FIG. 3 may be confounded.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for debugging an electronic circuit manufactured based on an initial program in hardware description language, HDL, said device comprising:
  an instrumentation unit capable of
    receiving the initial program;
    determining a first additional circuit to be incorporated in the electronic circuit and capable of activating a first observation signal representative of an operation of a portion of the electronic circuit corresponding to a determined portion of the initial program;
    determining a second additional circuit to be incorporated in the electronic circuit and capable of receiving at least one input signal and of activating a condition signal when a condition on the input signal is fulfilled during the operation of the electronic circuit, and a third additional circuit to be incorporated in the electronic circuit and capable of activating a second observation signal when the condition signal is activated;
    determining a fourth additional circuit to be incorporated in the electronic circuit and capable of memorizing data representative of the order of activation of the first and second observation signals; and
    providing a modified program in HDL language based on the initial program incorporating a description in HDL language of the first, second, third, and fourth additional circuits; and
  a debugging unit capable of debugging a modified electronic circuit manufactured based on the modified program by interacting with the modified electronic circuit via the fourth additional circuit.

2. The device of claim 1, wherein the debugging unit is, further, capable, based on said representative data, of displaying a reference of said determined portion of the initial program associated with the first observation signal and a reference of said second additional circuit associated with the second observation signal according to said order of activation of the first and second observation signals.

3. The device of claim 1, wherein the first additional circuit is capable of assigning to the first observation signal a value from among two distinct values, and of activating the first observation signal by assigning to the first observation signal the other value from among the two distinct values with respect to the preceding value of the first observation signal.

4. The device of claim 1, wherein the third additional circuit is capable of assigning to the second observation signal a value from among two distinct values, and of activating the second observation signal by assigning to the second observation signal the other value from among the two distinct values with respect to the preceding value of the second observation signal.

5. The device of claim 1, wherein the debugging unit is further capable of memorizing the value of the condition signal of the first observation signal and/or of the second observation signal.

6. The device of claim 1, wherein the electronic circuit is a programmable gate array circuit programmed based on the initial program and the modified electronic circuit is a programmable gate array circuit programmed based on the modified program.

7. A use of the device of any of claims 1 to 6 to determine code coverage rate of the initial program upon execution of tests.

8. A method for debugging an electronic circuit manufactured based on an initial program in hardware description language, HDL, comprising the steps of:

determining a first additional circuit to be incorporated in the electronic circuit and capable of activating a first observation signal representative of a operation of a portion of the electronic circuit corresponding to a determined portion of the initial program;

determining a second additional circuit to be incorporated in the electronic circuit and capable of receiving an input signal and of activating a condition signal when a condition on the input signal is fulfilled during the operation of the electronic circuit, and a third additional circuit to be incorporated in the electronic circuit and capable of activating a second observation signal when the condition signal is activated;

determining a fourth additional circuit to be incorporated in the electronic circuit and capable of memorizing data representative of the order of activation of the first and second observation signals;

providing a modified program in HDL language based on the initial program incorporating a description in HDL language of the first, second, third, and fourth additional circuits;

manufacturing a modified electronic circuit based on the modified program; and debugging the modified electronic circuit by interacting with the modified electronic circuit via the fourth additional circuit.

9. The method of claim 8, further comprising the step of, based on said representative data, displaying a reference of said determined portion of the initial program associated with the first observation signal and a reference of said second additional circuit associated with the second observation signal according to said order of activation of the first and second observation signals.

10. The method of claim 8, further comprising the step of memorizing the value of the condition signal upon activation of the first observation signal and/or of the second observation signal.

* * * * *

UNITED STATES PATENT AND TRADEMARK OFFICE
CERTIFICATE OF CORRECTION

| | |
|---|---|
| PATENT NO. | : 7,434,181 B2 |
| APPLICATION NO. | : 11/136119 |
| DATED | : October 7, 2008 |
| INVENTOR(S) | : Pierre Colle, Anne Waniens and Thomas Guillemin |

It is certified that error appears in the above-identified patent and that said Letters Patent is hereby corrected as shown below:

Title Page, item (75), inventor: change "La Ierrasse" to --La Terrasse--.

Signed and Sealed this

Ninth Day of December, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,434,181 B2 | Page 1 of 1 |
| APPLICATION NO. | : 11/136119 | |
| DATED | : October 7, 2008 | |
| INVENTOR(S) | : Pierre Colle, Anne Wantens and Thomas Guillermin | |

It is certified that error appears in the above-identified patent and that said Letters Patent is hereby corrected as shown below:

Paragraph (75), line 2, change "Waniens" to --Wantens--.

Signed and Sealed this

Twenty-seventh Day of January, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,434,181 B2  Page 1 of 1
APPLICATION NO. : 11/136119
DATED : October 7, 2008
INVENTOR(S) : Pierre Colle, Anne Wantens and Thomas Guillermin It is certified that error appears in the above-identified patent and that said Letters Patent is hereby corrected as shown below:

Title Page, Item (75), line 2, change "Waniens" to --Wantens--.

This certificate supersedes the Certificate of Correction issued January 27, 2009.

Signed and Sealed this

Seventeenth Day of February, 2009

JOHN DOLL
*Acting Director of the United States Patent and Trademark Office*